United States Patent
Schrott et al.

(10) Patent No.: US 11,889,660 B2
(45) Date of Patent: Jan. 30, 2024

(54) COOLING DEVICE FOR AN ELECTRICAL SWITCHING INSTALLATION AND METHOD FOR OPERATING A COOLING DEVICE OF THIS KIND

(71) Applicant: Siemens Aktiengesellschaft, Munich (DE)

(72) Inventors: Hans-Georg Schrott, Wiesenttal OT Streitberg (DE); Stefan Hans Werner Schönewolf, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 672 days.

(21) Appl. No.: 17/058,573

(22) PCT Filed: May 6, 2019

(86) PCT No.: PCT/EP2019/061500
§ 371 (c)(1),
(2) Date: Nov. 24, 2020

(87) PCT Pub. No.: WO2019/228759
PCT Pub. Date: Dec. 5, 2019

(65) Prior Publication Data
US 2021/0212240 A1    Jul. 8, 2021

(30) Foreign Application Priority Data
May 29, 2018    (EP) ..................................... 18174790

(51) Int. Cl.
*F28F 13/00*     (2006.01)
*H05K 7/20*      (2006.01)
(Continued)

(52) U.S. Cl.
CPC ......... *H05K 7/20281* (2013.01); *G01K 1/026* (2013.01); *G01K 3/08* (2013.01); *G01K 13/02* (2013.01)

(58) Field of Classification Search
CPC ...... H05K 7/20281; G01K 1/026; G01K 3/08; G01K 13/02
(Continued)

(56) References Cited

U.S. PATENT DOCUMENTS

2014/0000860 A1    1/2014 Kaisha
2014/0376593 A1*   12/2014 Ewing ..................... G01K 1/20
                                                            374/179
2018/0372551 A1*   12/2018 Jurski ..................... F24F 11/30

FOREIGN PATENT DOCUMENTS

CN        105890235 A  *  8/2016
DE    11 2011 105 018 T5   12/2013
(Continued)

OTHER PUBLICATIONS

PCT International Search Report and Written Opinion of International Searching Authority dated Aug. 29, 2019 corresponding to PCT International Application No. PCT/EP2019/061500 filed May 6, 2019.

*Primary Examiner* — Davis D Hwu
(74) *Attorney, Agent, or Firm* — Henry M. Feiereisen LLC

(57) ABSTRACT

A cooling device for an electrical installation, in particular, for a converter system of an electrical installation of a rail vehicle, includes a cooling path in which at least one power loss source is arranged and through which a coolant is able to flow. The cooling device includes a temperature sensor system configured to detect a failure of a mass flow of the coolant and includes at least two temperature sensors which are integrated in the cooling path in spaced-apart relationship in a transport direction of the coolant. The two tem-
(Continued)

perature sensors are arranged in the transport direction of the coolant upstream of a passage of the mass flow of the coolant through a region of overlap of the cooling path with the power loss source.

11 Claims, 3 Drawing Sheets

(51) Int. Cl.
    *G01K 1/02*     (2021.01)
    *G01K 3/08*     (2006.01)
    *G01K 13/02*     (2021.01)
(58) Field of Classification Search
    USPC .......................................................... 165/253
    See application file for complete search history.

(56) References Cited

FOREIGN PATENT DOCUMENTS

| | | |
|---|---|---|
| DE | 102013200772 A1 * | 7/2014 |
| DE | 10 2013 219 789 A1 | 4/2015 |
| JP | 2009 171702 A | 7/2009 |

\* cited by examiner

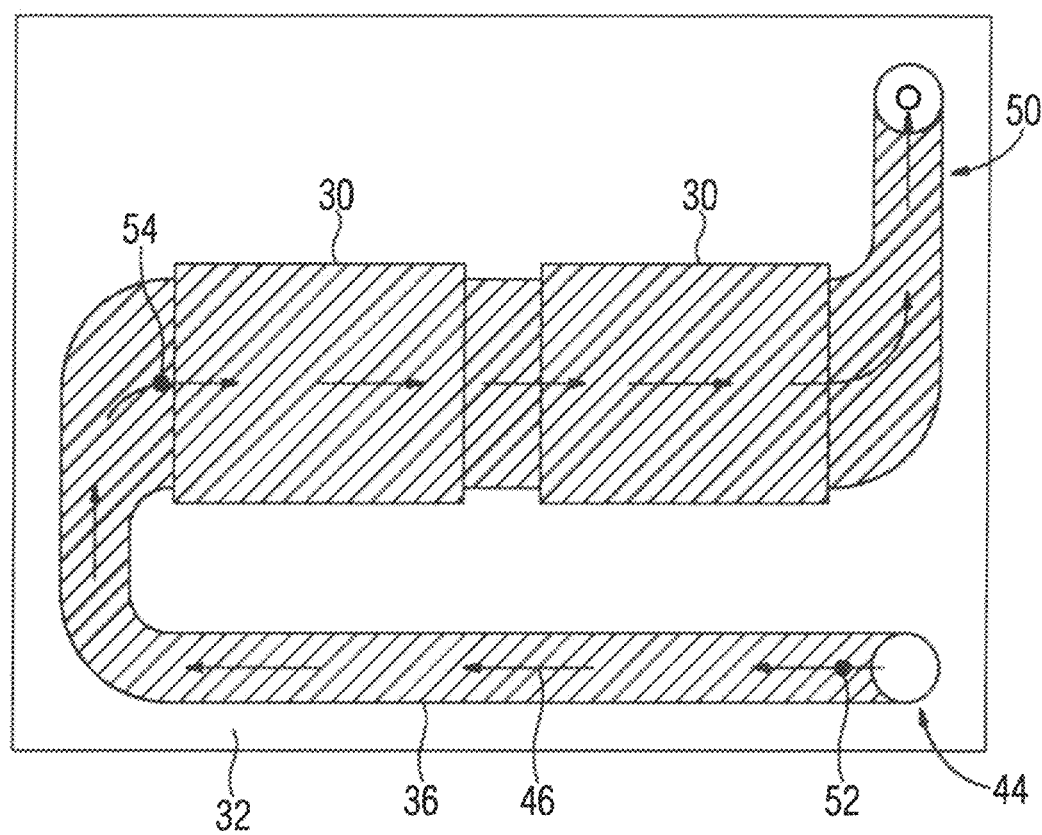

COOLING DEVICE FOR AN ELECTRICAL SWITCHING INSTALLATION AND METHOD FOR OPERATING A COOLING DEVICE OF THIS KIND

CROSS-REFERENCES TO RELATED APPLICATIONS

This application is the U.S. National Stage of International Application No. PCT/EP2019/061500, filed May 6, 2019, which designated the United States and has been published as International Publication No. WO 2019/228759 A1 and which claims the priority of European Patent Application, Serial No. 181747908, filed May 29, 2918, pursuant to 35 U.S C, 119(a)-(d).

BACKGROUND OF THE INVENTION

The invention relates to a cooling device for an electrical installation, in particular, for a converter system of an electrical installation of a rail vehicle, according to the preamble of claim 1. The invention further relates to a method for operating a cooling device of this kind according to the preamble of claim 5.

During the operation of electrical installations, for example, converter systems of an electrical installation of a rail vehicle in the rail transport sector, at power loss sources such as, for example, power semiconductors, correspondingly large losses occur in the form of thermal energy, that is, heat. In order thereby to prevent overheating of the installation, in particular, the electrical components such as Si-IGBT (Insulated Gate Bipolar Transistors) or SiC-MOSFET (Metal Oxide Semiconductor Field-Effect Transistor), a suitable heat removal is necessary. This typically takes place via coolants circulating in cooling circuits, in a liquid or gaseous state, which absorb and transport the thermal energy away.

A great problem thereby is presented by a failure of the cooling device, for example, the cooling circuit, so that the mass flow of the coolant stops abruptly and therefore no further heat is conducted away from the power loss sources. As a consequence, damage to the components to be cooled can result.

For this reason, a reliable monitoring of the mass flow of the coolant is unavoidable, in order to be able to take relevant measures—for example, the switch-off of the converter system—to prevent consequential damage in the event of a fault. It should be noted hereby that, with the increase in power density in power loss sources such as converters, a continuous and reliable conducting away of thermal energy gains greater importance.

For a high-capacity, reliable removal of the thermal energy, that is heat, produced, it is further required that erroneous or unintentional dropouts in the form of supposed, but actually non-existent, interruptions of the mass flow of the coolant must unfailingly be prevented in order to maintain a high level of availability and reliability of the electrical installation, for example, of the converter system contained therein. It should hereby be noted that, especially, sudden temperature changes of the coolant circulating in the cooling circuit can lead to such erroneous and unintentional triggering events if, as the detection principle, one or a plurality of temperature measurements are utilized for an identification of the interruption of the mass flow of the coolant. In the rail sector, such sudden temperature changes arise, for example, on sudden changes of the ambient conditions, for example, on entry of a rail vehicle into a tunnel, so that the further substance stream cooling the mass flow of the coolant in a heat exchanger—for example, the cooling air flowing through the heat exchanger—abruptly has a different temperature which consequently leads to the described temperature jump in the other substance stream of the heat exchanger, specifically the mass flow of the coolant.

According to the prior art shown in FIG. 1, several possibilities for recognizing the failure of the mass flow of coolant have previously been considered. Identifiable in FIG. 1, herein in a schematic view, is a cooling device for an electrical installation, in particular, for a converter system of a rail vehicle, in which a corresponding coolant channel of a cooling circuit is partially visible. Arranged within the cooling circuit is a heat exchanger (not visible here) for cooling the coolant, round which heat exchanger, for example, in the case of a rail vehicle, ambient air can flow as the one substance stream, by means of which the mass flow of the coolant enters into heat exchange as the second substance stream. In the present case, a cooling channel extends through a cooling body 12, which itself is connected, or thermally coupled, to a power loss source 14. The power loss source 14 is, for example, an IGBT (Insulated Gate Bipolar Transistor) module of the converter system. The input of thermal energy of heat from the power loss source 14 into the cooling body 12 is symbolized with arrows 16.

The failure of the mass flow of the coolant flowing through the cooling channel can now be determined, according to the prior art, in two different ways: firstly, systems with a respective sensor 18 are known, by means of which the mass flow or the coolant flow rate can be determined. However, such flow sensors 18 are often expensive and relatively unreliable. Secondly, it is known that the respective temperature sensors 20, 22 are arranged upstream or downstream of a passage 24 of the mass flow of the coolant through a region of overlap of the cooling circuit or the cooling channel 10 with the power loss source 14. The passage 24 is therefore to be understood as that length region of the cooling channel 10 which overlaps the power loss source 14.

By means of the temperature sensors 20, 22, therefore, a respective temperature of the coolant before entry into the passage 24 or after emergence therefrom is measured.

If the power loss input, that is, the input of thermal energy or heat by the power loss source 14 to be cooled into the coolant is known, then the temperature difference of the mass flow of the coolant detected via the two temperature sensors 20, 22 upstream and downstream of the power loss source 14 can be determined provided the heat capacity of the coolant is known. If the calculated value of the flow falls below a particular limit value, a fault can be assumed.

However, this system requires a precise knowledge of the momentary power loss by the power loss source 14 that is introduced into the cooling system. This requires an exact modelling of, for example, the circumstances and of the throughout behavior of the power loss source 14 provided for cooling when the power loss source 14 is configured as a power semiconductor (IGBT, MOSFET) in order to be able to determine continuously the losses resulting therefrom by means of a computer device. This involves a significant expenditure and uncertainty within the modelling. Furthermore, the determination of the respective temperatures of the coolant upstream and downstream of the power loss source 14 is sensitive to temperature jumps of the coolant entering into the cooling body 12 or the passage 24, for example, if the temperature of the coolant changes abruptly, on entry of the rail vehicle into a tunnel, as a consequence of the then altered heat exchanger environment. Since, specifically, the temperature difference of the two sensors 20, 22 is entered into the flow calculation, a jump in the coolant temperature before entry into the passage 24, which is already detected by the temperature sensor 20 arranged upstream of the power loss source 14, but due to the movement velocity of the coolant cannot yet be detected at the second temperature sensor 22 at the end of the passage 24, leads to an error in the calculated flow. Thus, an erroneous and unintended triggering of an identification of a failure of the mass flow of the coolant can occur.

From DE 11 2011 106 018 T5, there is known a coding system for a vehicle, having a flow channel which circulates a liquid medium which cools a drive apparatus of the vehicle. This cooling system comprises a plurality of temperature sensors which are provided at different positions of the flow channel. A heating element which is cooled by the liquid medium is provided in the flow channel. A flow rate of the liquid medium flowing through the flow channel is estimated on the basis of a time delay that is needed by the plurality of temperature sensors for detecting a temperature change caused by a change of a heat generating state of the heat element.

Additionally, from DE 10 2013 219 789 A1, there is known an apparatus for determining a flow rate of a coolant through a coding channel. The cooling channel is configured to cool a converter. At least one temperature sensor for determining the temperature of the coolant is provided at least at one site of the cooling channel. The determination of the flow rate of the coolant through the cooling channel takes place on the basis of the ascertained temperature at the at least one site and/or on the basis of a heat output determined by means of the measuring unit.

It is therefore an object of the present invention to provide a cooling device for an electrical installation, in particular, for a converter system of an electrical installation of a rail vehicle, and a method for operating such a cooling device by means of which, firstly, a simple and economic solution for failure identification can be realized, and which, secondly, is extremely invulnerable to an erroneous or unintended triggering event if a failure of the mass flow of the coolant has actually not occurred.

SUMMARY OF THE INVENTION

This object is achieved according to the invention with a cooling device as set forth hereinafter, and with a method for operating such a cooling device as set forth hereinafter. Advantageous embodiments with favorable developments of the invention are the subject matter of the respective dependent claims.

The cooling device according to the invention for an electrical switching installation, in particular, for a converter system of an electrical installation of a rail vehicle comprises a cooling path in which at least one power loss source is integrated or arranged and through which a liquid or gaseous coolant is able to flow. Furthermore, the cooling device comprises a temperature sensor system for detecting a failure of a mass flow of the coolant and thus for detecting a failure of the entire cooling device, wherein the temperature sensor system comprises two temperature sensors integrated in the cooling path spaced from one another in the transport direction of the coolant, which sensors are arranged, according to the invention, in the transport direction of the coolant, upstream of a passage of the mass flow of the coolant through a region of overlap of the cooling path with the power loss source. The region of overlap of the power loss source and the cooling path is defined as that region in which, in normal operation, the main heat flow is guided from the heat source to the coolant.

As distinct from the prior art whereby the respective temperatures of the coolant in its transport direction before its entry into the passage of the mass flow through the overlap region of the cooling path with the power loss source or after its emergence have been determined, it is now provided according to the invention to measure the respective temperatures at a greater and a lesser spacing before the entry into the passage of the mass flow of the coolant through the region of overlap of the cooling path with the power loss source.

The essential advantage of such a measurement is that therefore, in a simple manner, only a temperature difference between the two temperature measuring sites at a greater and lesser spacing before the entry into the passage of the mass flow of the coolant through the region of overlap of the cooling path with the power loss source must be evaluated, wherein a failure of the mass flow has always taken place if the temperature difference is significantly greater than in normal operation and, in the case of transient processes, the temperature rise of the coolant in the vicinity of the power loss source precedes the temperature rise at the detection site of the temperature of the coolant further from the power loss source. Both parts of these conditions can thereby be checked easily with a suitable overlaid control system. Herein, as distinct from the prior art, no complex modellings of the thermal behavior of the coolant or of the overall system and no knowledge of the power loss in the power loss source currently introduced into the coolant is needed to realize this discovery.

A further great advantage is that temperature jumps which arise, for example, in the presence of circulation and recirculation of the coolant, as a result of a temperature change, for example, in the region of the heat exchanger, as can occur in railway operation, for example, with changing temperatures on the train route (entry into a tunnel) can be intercepted far more robustly. Such a temperature change in the external environment leads specifically, for example, as a result of the then warmer substance stream of the cooling air on the heat exchanger, to such a temperature jump of the other substance stream, specifically the mass flow of the coolant, which is then detected by means of the two temperature sensors.

Since hereby, firstly, the temperature sensor further from the passage of the flow through the region of overlap of the cooling path with the power loss source detects a temperature rise, before this temperature rise is also detected by a second sensor arranged closer to the passage, this operating situation can be distinguished from a failure of the mass flow of the coolant in which the corresponding temporal temperature gradient is always detected first by the temperature sensor nearest the overlap region. Consequently, an extremely economical and fault-resistant overall system for monitoring the mass flow of the coolant within the cooling path results. The cooling path is thereby, in particular, part of a cooling circuit in which a heat exchanger is integrated. Nevertheless, an open system is also conceivable wherein, for example, ambient air is blown through the cooling path by means of a fan. The cooling circuit is then no longer fully closed (only via ambient air). A heat exchanger is then also not needed.

It is provided according to the invention that one temperature sensor is arranged in the transport direction of the coolant in the region of an entry of the mass flow into the cooling body and the other temperature sensor is arranged upstream in the vicinity of the passage of the mass flow through the region of overlap of the cooling path with the power loss source. In this way, in particular, a spreading out of heat as a result of the input of thermal energy by the power loss source in the event of a failure of the mass flow can be ascertained particularly quickly and reliably when the temperature sensor arranged upstream in the vicinity of the passage of the mass flow through the region of overlap of the cooling path with the power loss source determines a corresponding unusual temperature rise.

Furthermore, according to the invention, a computer device is provided which is configured to determine a temperature difference of the two detected temperatures of the coolant and to compare it with a limit value and to determine a detection sequence of a temperature change of the coolant at the measuring points and to compare it with a limit value.

In a further embodiment of the invention, it has been found to be advantageous if the power loss source is configured coupled in a heat-conducting manner to a cooling body integrated in the cooling path, for example, directly or in one piece therewith, wherein the two temperature sensors are then arranged on the cooling body. The cooling body thus provides, firstly, for a homogeneous conduction of the thermal energy away from the power loss source and enables a very fine and precise temperature detection by means of the two temperature sensors.

A further advantageous embodiment of the invention additionally provides a plurality of power loss sources, wherein the two temperature sensors are arranged spaced from one another in the transport direction of the coolant upstream of a passage of the mass flow through a region of overlap of the cooling path with one of the power loss sources. As a result, therefore, an overheating of a plurality of power loss sources arranged behind one another within the cooling path can be detected in a simple manner by a single arrangement of two temperature sensors upstream— seen in the transport direction of the coolant—of one of the power loss sources.

Finally, it has proved to be advantageous if the cooling path is part of a cooling circuit in which a heat exchanger is integrated. Such a system is particularly reliable and simple to operate.

The advantages described above in relation to the cooling device according to the invention result in the same way for the method for operating this cooling device as claimed in claim 5.

The method is also distinguished, in particular, in that by simple means, respective temperature differences of the temperatures of the coolant determined by means of the two temperature sensors can be calculated and a failure of the mass flow can then be determined easily if, for example, a limit value of this temperature difference is exceeded and the gradient of the temperature change of the coolant in the vicinity of the power loss source precedes the temperature change at the detection site of the temperature of the coolant further from the power loss source.

In this regard, it has been found to be particularly advantageous if, on exceeding the limit value, a signal regarding the failure of the mass flow of the coolant is transmitted to the higher-level installation so that the system switches off and the corresponding components of the installation can be protected against overheating.

Finally, the method according to the invention has the particularly favorable advantage that on determination of a temporal temperature gradient which is initially detected at the temperature sensor remote from the region of overlap and nearest to the inlet, a temperature jump of the coolant as a result of the changing environmental conditions and, in particular, as a result of temperature variations associated therewith can be assumed. Since therefore, firstly a temporal temperature gradient is initially detected in a simple manner by the temperature sensor remote from the region of overlap and nearest to the inlet, a failure of the mass flow can thus be distinguished in a particularly simple manner from such a temperature jump, which contributes significantly to the reliability of the installation so that unintended or incorrect switch-offs of the overall system can be prevented particularly easily and effectively.

BRIEF DESCRIPTION OF THE DRAWING

Further advantages and details of the invention are disclosed in the description below of preferred exemplary embodiments and the drawings. In the drawings, the same reference signs denote the same features and functions. In the drawings:

FIG. 6 is a schematic view of a cooling device for a converter system of an electrical installation of a rail vehicle, according to a further embodiment in which the failure of a plurality of power loss sources can be determined by means of a sensor system.

DETAILED DESCRIPTION OF PREFERRED EMBODIMENTS

Figure 1:
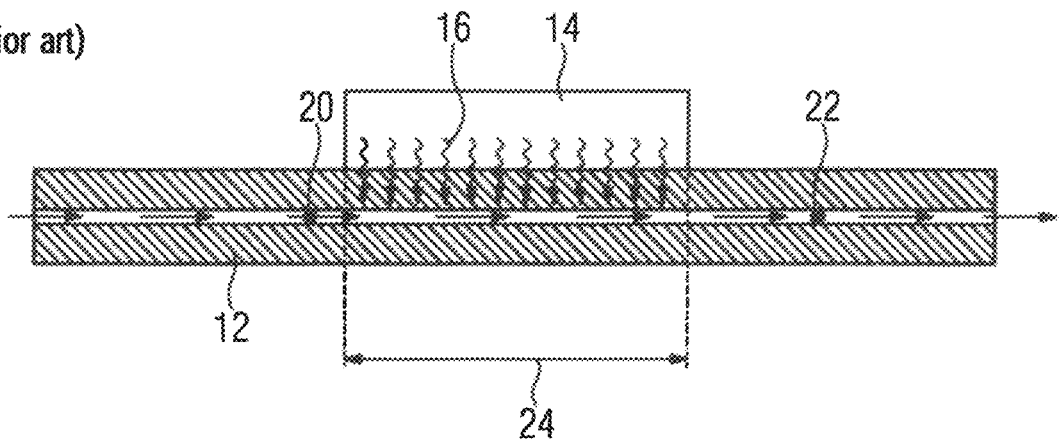
FIG. 1 shows a schematic view of a cooling device for a converter system of an electrical installation of a rail vehicle, according to the prior art.

While FIG. 1 shows a cooling device for a converter system of an electrical installation of a rail vehicle, according to the prior art, the cooling device according to the invention for a converter system of an electrical installation of a rail vehicle and a method for operating such a cooling device will now be described on the basis of two exemplary embodiments, making reference to FIGS. 2 to 6.

Figure 2:
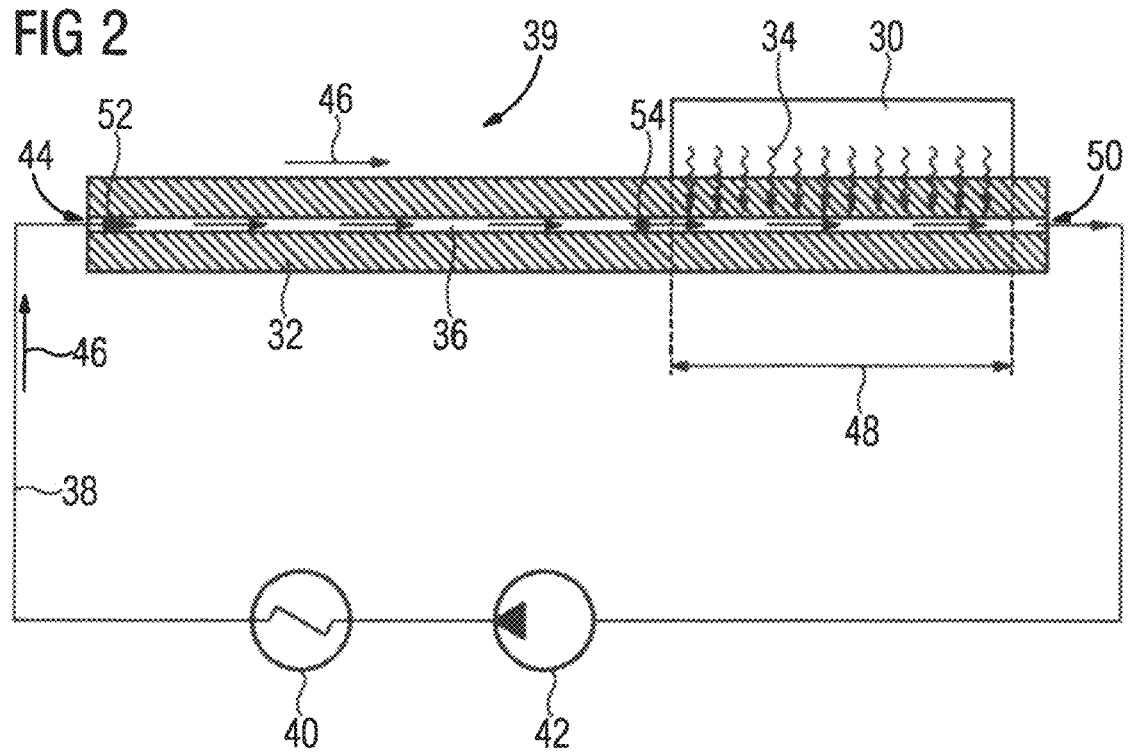
FIG. 2 shows a schematic view of a cooling device for a converter system of an electrical installation of a rail vehicle, according to a first embodiment of the invention.
Figure 3:
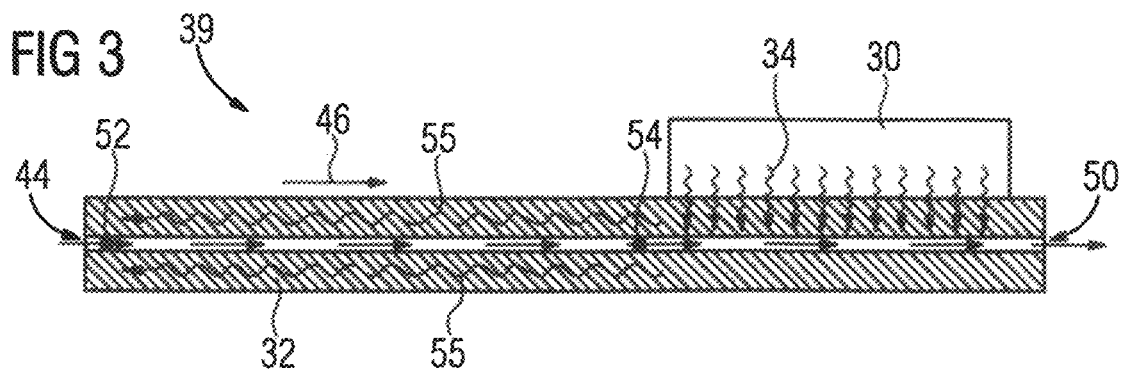
FIG. 3 shows a schematic view of the cooling device of FIG. 2, by means of which the functioning during a failure of a mass flow of a coolant of the cooling device is indicated.

FIG. 2 shows a schematic view of a cooling device for a converter system of an electrical installation of a rail vehicle, having a power loss source 30, which is configured, for example, as an SiC-MOSFET (Metal Oxide Semiconductor Field Effect Transistor) module. Such a component generates a high level of thermal energy, that is, heat, which must accordingly be removed in order to be protected against overheating. In the present exemplary embodiment, for this purpose, the power loss source 30 is connected to a correspondingly thermally well conducting cooling body 32, wherein a power loss input or a heat transfer of the thermal energy generated by the power loss source 30 into the cooling body 32 is symbolized with arrows 34. In the present case, the power loss source 30 and the cooling body 32 are constructed separately. Similarly, however, it is also conceivable that the two components are constructed integrally. Additionally, the power loss source 30 can have an integrated cooling body 32.

As is also apparent from FIG. 2, a cooling channel 36 which itself is part of a cooling path 39 of the cooling circuit 38 extends through the cooling body 32. Integrated in this cooling circuit 38, which is symbolically indicated in FIG. 2, is a heat exchanger 40 and a pump 42 by means of which a liquid or gaseous cooling medium or coolant is circulated or recirculated within the cooling circuit 38. In place of a pump 42, another circulating apparatus is naturally conceivable.

By means of the heat exchanger 40, heat stored in the coolant which said coolant has absorbed through the loss input by the power loss source 30 is transferred in a per se known manner to a second substance stream. This second substance stream is formed in rail vehicles, for example, by the ambient air which is accelerated, for example, by a fan and then flows through the heat exchanger 40 or cooler and thereby cools the substance stream or mass flow of the coolant circulating in the cooling circuit 38.

The coolant cooled in the heat exchanger 40 enters within the cooling path 39 in the region of an entry 44 of the mass flow into the cooling channel 36 provided within the cooling body 32. In the further course of the mass flow or in the further course, indicated with an arrow 46, of a transport direction of the cooling circuit 38 or of the cooling path 39, the coolant then enters a longitudinal region or a passage 48 of the mass flow within the cooling channel 36 into the region of overlap of the cooling circuit 38 with the power loss source 30. The region of overlap of the power loss source 30 and the cooling circuit 38 or the cooling passage 39 is defined as that region in which the main heat flow is guided from the heat source to the coolant in normal operation. The passage 48 is therefore to be understood as that portion of the cooling channel 36 in which the mass flow of the coolant is substantially arranged in overlap with the power loss source 30. In the region of this passage 48, therefore, the power loss input (arrow 34) also takes place from the power loss source 30 via the cooling body 32 into the coolant. In the present case, for example, water is used as the coolant. Once the coolant has passed the cooling body 32, it emerges again at an outlet 50, therefrom or from the cooling channel 36 and from there passes out again to the pump 42, by means of which the coolant passes again, in its further course, to the heat exchanger 40 in which it emits the heat absorbed from the power loss source 30 to the ambient air flowing through the heat exchanger 40.

It is also apparent from FIG. 2 that a temperature sensor system is part of the cooling device which, in the present case, comprises a first temperature sensor 52 and a second temperature sensor 54. The one, first temperature sensor 52 is thereby arranged—in relation to the transport direction 46 of the coolant—in the region of the entry 44 of the mass flow into the cooling body 32. The second temperature sensor 54 is arranged in the vicinity, or directly upstream, of the passage 48 of the mass flow through the region of overlap of the cooling circuit 38 or the cooling path 39 with the power loss source 30. The temperature sensors 52, 54 are therefore arranged—in relation to the transport direction 46 of the coolant—upstream of the passage 48 of the mass flow through the region of overlap of the cooling circuit 38 with the power loss source 30. Thereby, the two temperature sensors 52, 54 can also be arranged, where relevant, outside the cooling body 32 directly in corresponding conduits of the cooling circuit 38. The present arrangement of the temperature sensors 52, 54 within the cooling body 32 is, however, particularly advantageous since here a good thermal coupling of the sensors to the coupling medium exists.

The method for operating the cooling device now provides that with coolant circulating, by means of the two temperature sensors 52, 54, the respective temperature at the entry 44 or upstream of the passage 48 is determined. As is apparent from the graphical representation of FIG. 4, close to the ordinate there, the respective temperature measurement curves A, B typically extend constantly and parallel to one another over time. The temperature measurement curve A of the temperature determined with the temperature sensor 52 at the entry 44 is typically lower than the temperature measurement curve B of the temperature determined with the temperature sensor 54 in the region upstream of the passage 48. This is related to the fact that at the measuring point of the second temperature sensor 54, the power loss input through the power loss source 30 leads to the fact that in this region, the cooling body 32 or the coolant flowing in this region has a slightly raised temperature. The temperature A therefore corresponds to the coolant infeed temperature. The temperature B measured by the temperature sensor 54, however, is only slightly higher than the temperature A since a portion of the power input by the power loss source 30 spreads out against the flow direction of the coolant and so the temperature which is represented by the temperature measurement curve B is slightly raised. A temperature difference can thus be determined in that the value of the temperature measurement curve A is subtracted from the value of the temperature measurement curve B. In normal operation of the cooling device, a slight positive temperature difference $\Delta T$ is therefore determined.

If now, at a time point (line 53), a failure of the pump 42 or some other disruption of the mass flow of the coolant within the cooling circuit 38 occurs, then as a consequence of the continuing power loss input from the power loss source 30 into the cooling body 32 or into the coolant, a temperature elevation results directly under the power loss source 30 or via the passage 48 in the region of overlap of the power loss source 30 with the cooling channel 36. Due to the resulting temperature difference or due to the spread of the thermal energy or heat introduced into the coolant, there results a heat flow counter to the normal flow direction 46 of the mass flow of the coolant, as indicated by corresponding lines 55 in FIG. 3.

Figure 4:
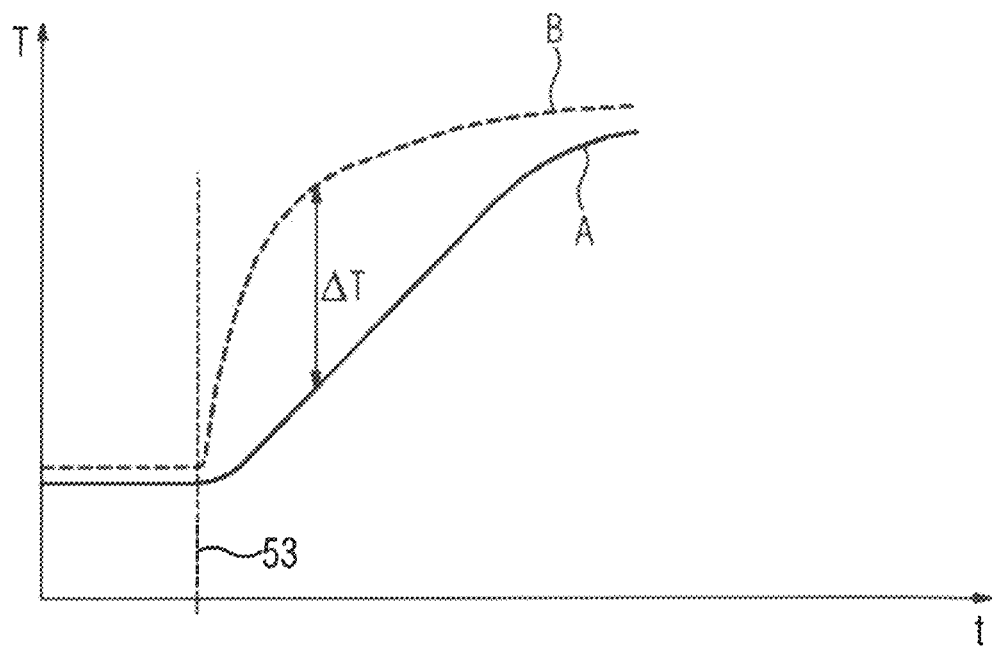
FIG. 4 is a graphical representation of the temperatures detected over time by a temperature sensor system, wherein by means of a temperature difference, a failure of the mass flow of the coolant is detectable.

By reason of this heat flow counter to the normal flow direction 46, the temperature determined by the temperature sensor 54 increases very rapidly and strongly, as is shown in FIG. 4 by the temperature curve B. Markedly delayed and to a lesser extent, due to the spacing from the power loss source 30, the temperature at the entry 44 into the cooling body 32 measured by the temperature sensor 52 also increases. This delay results as a consequence of the heat stream spreading counter to the normal flow direction 46, which still needs some time after reaching the measuring point in the region of the temperature sensor 54 until the temperature sensor 52 in the region of the entry 44 into the cooling body 32 also measures a corresponding temperature elevation.

The course of this temperature curve A in the region of the entry 44 is also shown in FIG. 4.

From FIG. 4, it is thus clear that after the time point, indicated with the dashed line 53, of the failure of the coolant circulation or recirculation of the mass flow within the cooling circuit 38, a marked elevation of the temperature measurement curve B and—subsequently and more moderately—of the temperature measurement curve A takes place. Therefore, the temperature difference ΔT increases, as is clearly shown in the graphical representation of FIG. 4.

The temperature difference ΔT can be continuously checked by means of an evaluating unit. The temperature difference ΔT can be compared in a computer unit with a limit value which defines a failure of the mass flow. On exceeding the limit value, a signal regarding the failure of the mass flow of the coolant can be transmitted to the installation. Therefore, a failure of the coolant mass flow has taken place whenever the temperature difference ΔT between the temperature sensor 54 and the temperature sensor 52 is markedly greater than in normal operation and the temperature rise in the region of the temperature sensor 54 precedes the temperature rise in the region of the temperature sensor 52. Both parts of this condition can be checked with a suitable overlaid control system.

Figure 5:
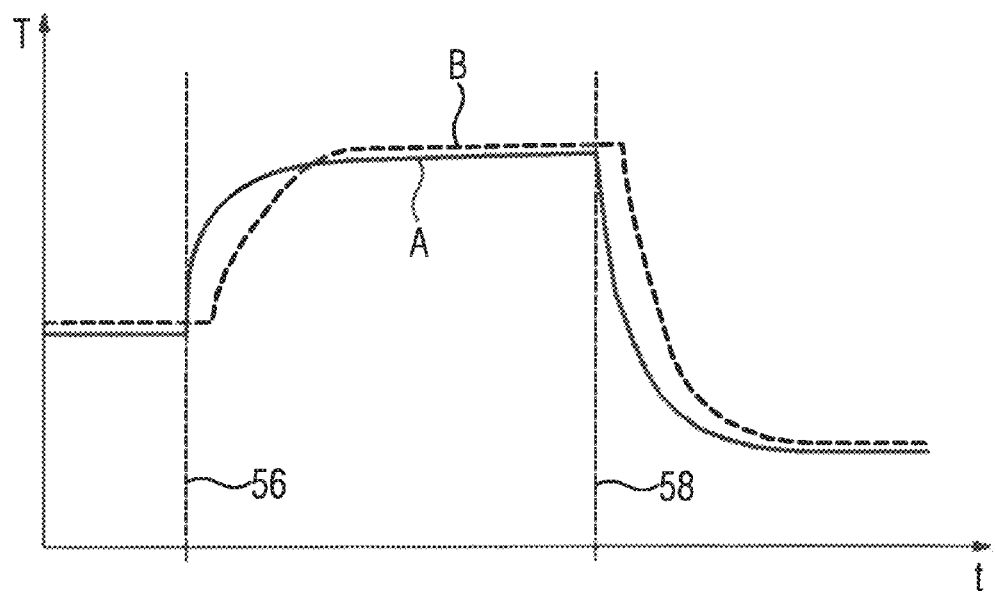
FIG. 5 is a further graphical representation of the course over time of the temperatures determined by the corresponding temperature sensors, wherein respective temperature variations are recognizable, by means of which a temperature jump of the coolant due to changed environmental conditions of the rail vehicle are determinable.

FIG. 5 shows a further graphical representation of the temperature of the two temperature measurement curves A, B over time t. Two temperature jumps 56, 58 at respective time points are represented here in the graphical representation. Such temperature jumps 56, 58 arise, for example, on a significant change of the conditions in the heat exchanger 40, specifically when the rail vehicle enters a tunnel in which a significantly different temperature exists than previously. If, consequently, the coolant recirculation and the circulation of the mass flow is active and a temperature jump occurs, for example, in the substance stream of the heat exchanger, that is, of the cooling air, this leads accordingly to a temperature jump in the coolant. This jump arises in the coolant inflow, specifically due to the flow direction of the coolant, always firstly at the temperature sensor 52 close to the entry 44 and, with a temporal delay thereafter before entry of the coolant into the passage 48, at the temperature sensor 54. The detection sequence of the temperature change is therefore exactly reversed relative to the failure of the mass flow, as has been described above. Therefore, on the first temperature jump at the line 56, a negative temperature difference ΔT is determined between the temperature measurement curve B and the temperature measurement curve A, which differs as a result of the changed sign from the temperature difference ΔT which is detected on a failure of the mass flow. A coolant jump in the inlet can thus be clearly distinguished from a mass flow failure of the coolant.

The second temperature jump of the coolant indicated in the region of the line 58 occurs, for example, after leaving the tunnel until the shape of the temperature measurement curves A and B over time has normalized again.

Finally, FIG. 6 shows a further exemplary embodiment of the cooling device in a schematic view, whereby the cooling channel 36 of the cooling circuit 38 is indicated extremely schematically. A cooling body 32 in the form of a cooling plate is arranged on this cooling channel 36, on which plate two power loss sources 30 are again arranged, for example, in the form of respective power semiconductors. Also shown are the respective temperature sensors 52, 54 which are arranged accordingly at a greater or smaller separation from the respective power loss source 30. It is apparent herein, in particular, that on use of two power loss sources 30, only one temperature sensor system with a pair of temperature sensors 52, 54 is required, by means of which the failure of both the front and also the rear power loss source 30, seen in the transport direction 46 of the coolant, can then be detected. In other words, even if two power loss sources 30 are used, only one pair of temperature sensors 52, 54 is required.

What is claimed is:

1. A cooling device for an electrical installation, said cooling device comprising:
a cooling path in which at least one power loss source is arranged and through which a coolant is able to flow in a transport direction;
a temperature sensor system for detecting the presence of a failure of a mass flow of the coolant, said temperature sensor system comprising at least two temperature sensors which are arranged in the cooling path in spaced-apart relationship in the transport direction of the coolant upstream of a passage of the mass flow of the coolant through a region of overlap of the cooling path with the power loss source, with one of the at least two temperature sensors arranged in the transport direction of the coolant in a region of an entry of the mass flow into the cooling path, and with the other one of the at least two temperature sensors arranged upstream in vicinity of the passage of the mass flow through the region of overlap of the cooling path with the power loss source; and
a computer device configured to
determine a temperature difference between a temperature detected by the one of the at least two temperature sensors and a temperature detected by the other one of the at least two temperature sensors,
compare the temperature difference with a limit value,
determine a detection sequence of a temperature change of the coolant at measuring points of the at least two temperature sensors, and
compare the detection sequence with a limit value.

2. The cooling device of claim 1, constructed for a converter system of an electrical installation of a rail vehicle.

3. The cooling device of claim 1, wherein a failure of the coolant mass flow has taken place when the temperature difference is markedly greater than a temperature difference in a normal operation and a temperature rise in a region of the other one of the at least two temperature sensors precedes a temperature rise in a region of the one of the at least two temperature sensors.

4. The cooling device of claim 1, further comprising a cooling body having integrated therein the cooling path and being heat-conductingly coupled to the power loss source, said at least two temperature sensors being arranged on the cooling body.

5. The cooling device of claim 1, wherein in the presence of a plurality of power loss sources, the at least two temperature sensors are arranged in spaced-apart relationship upstream of the passage of the mass flow through a region of overlap of the cooling path with one of the plurality of power loss sources.

6. The cooling device of claim 1, further comprising a cooling circuit, and a heat-exchanger which is integrated in the cooling circuit, said cooling path being part of the cooling circuit.

7. A method for operating a cooling device for an electrical installation, in particular for a converter system of an electrical installation of a rail vehicle, said method comprising:
detecting by a first temperature sensor a temperature of a coolant as a mass flow of the coolant enters a cooling path in which a power loss source is arranged, and flows in a transport direction;
detecting by a second temperature sensor in spaced-apart relationship in a transport direction to the first temperature sensor a temperature of the coolant upstream in vicinity of a passage of the mass flow through a region of overlap of the cooling path with the power loss source, monitoring on the basis of the detected first and second temperatures of the coolant the presence of a failure of the mass flow of the coolant flowing through a cooling path;

determining by a computer device a temperature difference between the detected first and second temperatures of the coolant;

comparing the determined temperature difference with a limit value;

determining by the computer device a detection sequence of a temperature change of the coolant at measuring points of the first and second temperature sensors; and comparing the detection sequence with a limit value.

8. The method of claim 7, wherein the presence of a failure of the mass flow of the coolant is determined when the temperature difference is markedly greater than a temperature difference in a normal operation and a temperature rise in a region of the second temperature sensor precedes a temperature rise in a region of the first temperature sensor.

9. The method of claim 7, further comprising:
arranging the first and second temperature sensors on a cooling body having integrated therein the cooling path, and
heat-conductingly coupling the cooling body to the power loss source.

10. The method of claim 7, further comprising transmitting a signal to the electrical installation when the temperature difference exceeds the limit value to indicate the presence of the failure of the mass flow.

11. The method of claim 7, further comprising distinguishing a temperature jump of the coolant from a failure of the mass flow of the coolant by evaluating the temperature difference and the detection sequence of a temperature change of the coolant at the first and second temperature sensors.

* * * * *